United States Patent
Tian

(10) Patent No.: US 10,036,675 B2
(45) Date of Patent: Jul. 31, 2018

(54) PIEZOELECTRIC FILM SENSOR, PIEZOELECTRIC FILM SENSOR CIRCUIT AND METHODS FOR MANUFACTURING THE SAME

(71) Applicant: BOE TECHNOLOGY GROUP CO., LTD., Beijing (CN)

(72) Inventor: Xueyan Tian, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/209,350

(22) Filed: Jul. 13, 2016

(65) Prior Publication Data

US 2017/0194427 A1    Jul. 6, 2017

(30) Foreign Application Priority Data

Jan. 4, 2016 (CN) .......................... 2016 1 0003669

(51) Int. Cl.
  *G01L 1/16* (2006.01)
  *H01L 29/786* (2006.01)
  (Continued)

(52) U.S. Cl.
  CPC .............. *G01L 1/16* (2013.01); *G01L 1/2293* (2013.01); *H01L 27/20* (2013.01); *H01L 29/786* (2013.01);
  (Continued)

(58) Field of Classification Search
  None
  See application file for complete search history.

(56) References Cited

U.S. PATENT DOCUMENTS

2005/0105784 A1    5/2005  Nam
2007/0075403 A1*   4/2007  Sakashita .......... H01L 21/02518
                                                       257/626
(Continued)

FOREIGN PATENT DOCUMENTS

| CN | 1619816 A | 5/2005 |
| CN | 104613861 A | 5/2015 |
| WO | WO-2013129101 A1 | 9/2013 |

OTHER PUBLICATIONS

First Office Action regarding Chinese Application No. 201610003669.5, dated Sep. 11, 2017. Translation provided by Dragon Intellectual Property Law Firm.

(Continued)

*Primary Examiner* — Michelle Mandala
(74) *Attorney, Agent, or Firm* — Harness, Dickey & Pierce, P.L.C.

(57) ABSTRACT

The present disclosure provides a piezoelectric film sensor, a piezoelectric film sensor circuit and methods for manufacturing the same. The method for manufacturing the piezoelectric film sensor comprises: a step of forming a piezoelectric film on a substrate, and a step of subjecting the piezoelectric film to laser annealing using a laser annealing process so as to complete phase-forming transition of the piezoelectric film. Since the annealing temperature in the laser annealing process can be controlled in a range of 300° C. to 400° C., the manufacturing process can be not only applied to ensure a good performance of a piezoelectric film, but also can be used for manufacturing a flexible piezoelectric film sensor.

18 Claims, 6 Drawing Sheets

(51) Int. Cl.
*H01L 29/84* (2006.01)
*H01L 51/00* (2006.01)
*G01L 1/22* (2006.01)
*H01L 27/20* (2006.01)
*H01L 41/113* (2006.01)
*H01L 41/253* (2013.01)
*H01L 41/187* (2006.01)
*H01L 41/318* (2013.01)

(52) U.S. Cl.
CPC .......... *H01L 29/84* (2013.01); *H01L 41/1132* (2013.01); *H01L 41/253* (2013.01); *H01L 51/0027* (2013.01); *H01L 51/0048* (2013.01); *H01L 41/1871* (2013.01); *H01L 41/1876* (2013.01); *H01L 41/318* (2013.01)

(56) References Cited

U.S. PATENT DOCUMENTS

| | | | | |
|---|---|---|---|---|
| 2007/0219375 A1* | 9/2007 | Fujiyama | ............... | B82Y 10/00 546/278.7 |
| 2011/0211316 A1* | 9/2011 | La Rosa | ................. | H01L 27/28 361/750 |
| 2015/0200235 A1 | 7/2015 | Wang et al. | | |

OTHER PUBLICATIONS

Adarsh Rajashekhar et al., "In Situ Laser Annealing During Growth of Pb(Zr0.52Ti0.48)O3 Thin Films", Applied Physics Letters, vol. 103, Jul. 19, 2013, p. 032908.
Second Chinese Office Action regarding Application No. 201610003669.5 dated Apr. 19, 2018.

* cited by examiner

PIEZOELECTRIC FILM SENSOR, PIEZOELECTRIC FILM SENSOR CIRCUIT AND METHODS FOR MANUFACTURING THE SAME

CROSS-REFERENCE TO RELATED APPLICATION

This application claims a priority to Chinese Patent Application No. 201610003669.5 filed on Jan. 4, 2016, the disclosures of which are incorporated in their entirety by reference herein.

TECHNICAL FIELD

The present disclosure relates to the field of piezoelectric film sensor technology, in particular to a piezoelectric film sensor, a piezoelectric film sensor circuit and methods for manufacturing the same.

BACKGROUND

Microelectro Mechanical Systems (MEMS) belong to a multi- and cross-disciplinary advanced research field developed based on microelectronic technology. MEMS sensors are novel sensors made using microelectronic and micro-mechanical processing technology. MEMS sensors, compared with those in the related art, have characteristics of a small volume, a light weight, low cost, low power consumption, high reliability, suitability for mass production, ease of integration and realization of intellectualization. The development of the MEMS technology brings enormous opportunities to the study of micro-sensors and micro-actuators based on piezoelectric film and silicon micromachining technologies. Especially MEMS piezoelectric film sensors have advantages of low energy consumption, high sensitivity, ease of being integrated with a piezoelectric micro-actuator, etc, which make them have great value of application in the fields of medical treatment, automotive electronics, motion tracking systems, etc.

MEMS piezoelectric film sensors in the related art are generally developed based on silicon chip technology. Their manufacturing substrate is a silicon wafer and their technical route is a typical manufacturing process of semiconductor. However, in recent years, some new products of medical and wearable devices create a new sensor market which will focus on the manufacturing of flexible sensors. At present, related studies have been started in foreign countries.

SUMMARY

In view of the above, the present disclosure provides a piezoelectric film sensor, a piezoelectric film sensor circuit and methods for manufacturing the same, so as to solve the problem in related art that an annealing process of piezoelectric films can hardly be applied to flexible piezoelectric film sensors.

In order to solve this technical problem, the present disclosure provides a method for manufacturing a piezoelectric film sensor, which comprises: a step of forming a piezoelectric film on a substrate; and a step of subjecting the piezoelectric film to laser annealing using a laser annealing process so as to complete phase-forming transition of the piezoelectric film.

In one example, an annealing temperature in the step of subjecting the piezoelectric film to laser annealing using the laser annealing process is in the range of 300° C. to 400° C.

In one example, the piezoelectric film is subjected to the laser annealing using a laser beam at a wavelength of 10.6 μm and a power density of 490 W/cm² for 25 seconds.

In one example, a laser beam for the laser annealing process is generated by a $CO_2$ laser or a $Y_3A_{15}O_{15}$ (YAG) laser.

In one example, the piezoelectric film is made of lead zirconate titanate or barium zirconate titanate.

In one example, the piezoelectric film has a thickness in the range of 0.5 to 1.5 μm.

In one example, the method for manufacturing a piezoelectric film sensor further comprises:

a step of forming an upper electrode and a lower electrode of the piezoelectric film sensor.

In one example, the substrate is a flexible base substrate.

The present disclosure further provides a method for manufacturing a piezoelectric film sensor circuit, which comprises: a step of forming a piezoelectric film sensor, and a step of forming a thin film transistor connected with the piezoelectric film sensor, wherein the piezoelectric film sensor is formed using the method for manufacturing a piezoelectric film sensor as described above.

The present disclosure further provides a method for manufacturing a piezoelectric film sensor circuit, which comprises:

forming a flexible base substrate on a rigid base substrate;

forming a pattern of a gate electrode of a thin film transistor on the flexible base substrate;

forming a gate insulating layer;

forming a pattern of a lower electrode of the piezoelectric film sensor;

forming a piezoelectric film, subjecting the piezoelectric film to laser annealing using a laser annealing process so as to complete phase-forming transition of the piezoelectric film, and patterning the piezoelectric film which has been subjected to laser annealing by using a photoetching process so as to form a pattern of the piezoelectric film;

forming a pattern of an active layer of the thin film transistor;

forming a pattern of an insulating layer;

forming a pattern of a source electrode and a drain electrode of the thin film transistor, wherein the source electrode and the drain electrode are connected with the active layer, and the source electrode or the drain electrode is connected with the lower electrode of the piezoelectric film sensor;

forming a pattern of an upper electrode of the piezoelectric film sensor; and peeling off the flexible base substrate which is provided with the thin film transistor and the piezoelectric film sensor from the rigid base substrate.

The present disclosure further provides a piezoelectric film sensor manufactured by the method for manufacturing a piezoelectric film sensor as described above.

The present disclosure further provides a piezoelectric film sensor circuit manufactured by the method for manufacturing a piezoelectric film sensor circuit as described above.

The present disclosure further provides a piezoelectric film sensor circuit, which comprises:

a flexible base substrate;
a gate electrode of a thin film transistor;
a gate insulating layer;
a lower electrode of a piezoelectric film sensor;
a piezoelectric film of the piezoelectric film sensor;
an active layer of the thin film transistor;
an insulating layer;

a source electrode and a drain electrode of the thin film transistor, wherein the source electrode and the drain electrode are connected with the active layer, and the source electrode or the drain electrode is connected with the lower electrode; and an upper electrode of the piezoelectric film sensor.

In one example, the active layer is made of poly(3-hexylthiophene) or single-walled carbon nanotubes.

In one example, the insulating layer is made of poly-p-xylene.

The above-mentioned technical solutions of the present disclosure have advantages as follows:

The phase-forming transition of the piezoelectric film is completed by subjecting the piezoelectric film to laser annealing using a laser annealing process. The annealing temperature in the laser annealing process can be controlled within a range of 300° C. to 400° C., thus the manufacturing process can be not only applied to ensure a good performance of the piezoelectric film, but also can be used for manufacturing a flexible piezoelectric film sensor.

DETAILED DESCRIPTION

Figure 1:
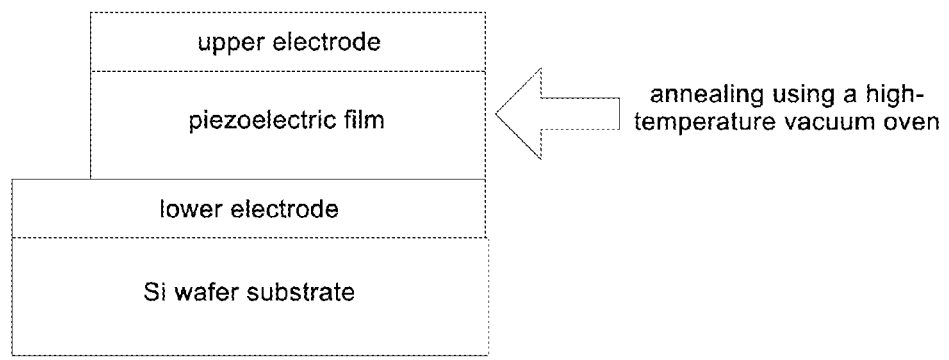
FIG. 1 is a structural representation of a piezoelectric film sensor in the related art.

Please referring to FIG. 1 which is a structural representation of a piezoelectric film sensor, when manufacturing a piezoelectric film layer of the piezoelectric film sensor, it is required to use a high-temperature (from 600° C. to 700° C.) vacuum oven annealing process so as to complete the phase-forming transition of the piezoelectric film layer and improve the performance of the piezoelectric film sensor. However, a flexible substrate can usually withstand only a temperature of 400° C. at most. Therefore, how to manufacture a piezoelectric film on a flexible substrate becomes a technical difficulty of a high-performance flexible piezoelectric film sensor.

In order to solve the problem that the process of annealing the piezoelectric film using a high-temperature vacuum oven of 600° C. to 700° C. can hardly be applied to the manufacturing of flexible piezoelectric film sensors when manufacturing the piezoelectric film sensors, the present disclosure provides a method for manufacturing a piezoelectric film sensor, comprising:

Step S11: forming a piezoelectric film on a substrate; and

Step S12: subjecting the piezoelectric film to laser annealing using a laser annealing process so as to complete phase-forming transition of the piezoelectric film.

In one example, an annealing temperature in the step of subjecting the piezoelectric film to laser annealing using the laser annealing process is in the range of 300° C. to 400° C.

Since the annealing temperature of the laser annealing process is flexible and controllable, and the annealing temperature can be controlled in the range of 300° C. to 400° C., the manufacturing process can be not only applied to ensure a good performance of a piezoelectric film, but also can be used for manufacturing a flexible piezoelectric film sensor.

Of course, the laser annealing process described above is also applicable to the manufacturing of rigid piezoelectric film sensors, such as the manufacturing of a piezoelectric film sensor using a silicon wafer as a base substrate.

Furthermore, in one example, in addition to the step of manufacturing the piezoelectric film, the method for manufacturing a piezoelectric film sensor further comprises a step of forming an upper electrode and a lower electrode of the piezoelectric film sensor, wherein the piezoelectric film is located between the upper and lower electrodes.

In one example, the piezoelectric film can be made of lead zirconate titanate ($Pb(Zr_{0.52}Ti_{0.48})O_3$, PZT) or barium zirconate titanate ($Ba(Zr_{0.1}Ti_{0.9})O_3$, BZT). Advantages of choosing PZT for manufacturing piezoelectric films lie in a high piezoelectric coefficient, small changes in electromechanical parameters varying with environmental conditions such as temperature, time, etc, and high working stability. Advantages of choosing BZT for manufacturing piezoelectric films lie in high piezoelectric coefficient and dielectric constant, very low leakage current, a lead-free material and good biocompatibility. That is to say, choosing PZT or BZT for manufacturing piezoelectric film can ensure work precision and high stability of the piezoelectric film sensor.

In one example, the piezoelectric film formed using the manufacturing method described above has a thickness in the range of 0.5 to 1.5 μm. In a further example, the piezoelectric film has a thickness of 1 μm. The formed piezoelectric film has a smaller thickness, thereby making the manufactured piezoelectric film sensor lighter and thinner and applicable in more fields.

In one example, laser beam for the laser annealing process can be generated by a $CO_2$ (carbon dioxide) laser or a YAG ($Y_3Al_{15}O_{15}$) laser.

In one example, the piezoelectric film is subjected to the laser annealing using a laser beam at a wavelength of 10.6 μm and a power density of 490 W/cm² for 25 seconds.

In one example, the substrates in the above-mentioned embodiments are flexible base substrates.

The present disclosure further provides a method for manufacturing a piezoelectric film sensor circuit, comprising: a step of forming a piezoelectric film sensor and a step of forming a thin film transistor connected with the piezoelectric film sensor, wherein the piezoelectric film sensor can be formed using the manufacturing method according to any of the above-mentioned embodiments.

Figure 2:
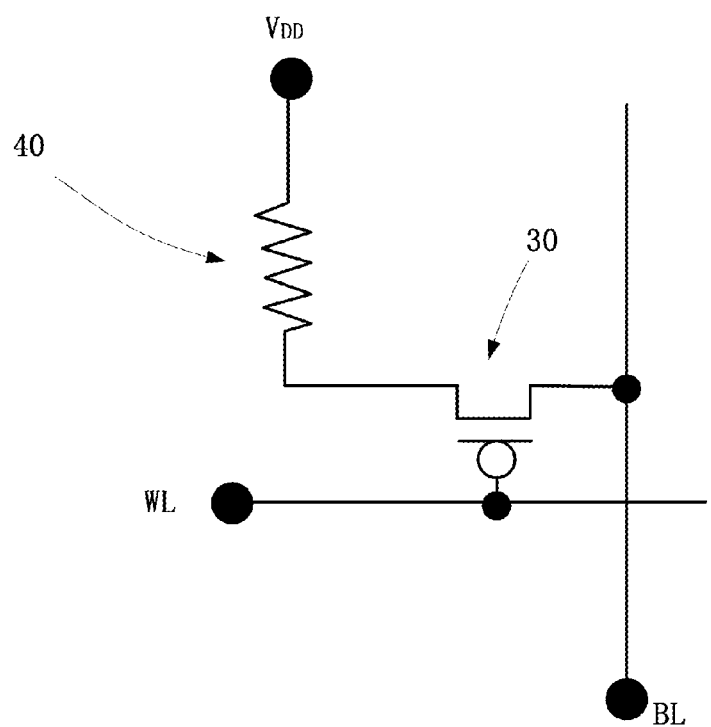
FIG. 2 is a schematic diagram of connecting structures of a piezoelectric film sensor circuit of one embodiment according to the present disclosure.
Figure 3:
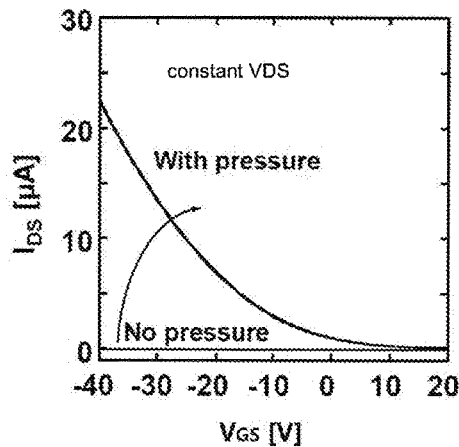
FIG. 3 is a schematic diagram of the working principle of a piezoelectric film sensor circuit of one embodiment according to the present disclosure.

Please refer to FIGS. 2 and 3. FIG. 2 is a schematic diagram of connecting structures of a piezoelectric film sensor circuit of one embodiment according to the present disclosure, and FIG. 3 is a schematic diagram of a working principle of a piezoelectric film sensor circuit of one embodiment according to the present disclosure. As can be seen from FIG. 2, a gate electrode of a thin film transistor 30 is connected with a signal line WL (wordline), and one of a source electrode and a drain electrode is connected with one electrode of a piezoelectric film sensor 40, and the other is connected with a signal line BL (bitline). One electrode of the piezoelectric film sensor 40 is connected with the thin film transistor 30, and the other electrode is connected with a power supply $V_{DD}$. The piezoelectric film in the piezoelectric film sensor 40 can be deformed under external pressure, thus causing the piezoelectric film sensor 40 to generate an electrical signal; or the piezoelectric film can be deformed when the power supply $V_{DD}$ applies a voltage signal to the piezoelectric film sensor 40, so as to cause the piezoelectric film sensor 40 to generate an electrical signal. When the WL is at a high electric potential, the thin film transistor is turned on, and in this case, the signal of the piezoelectric film sensor 40 can be read from the signal line BL, or data can be written in the piezoelectric film sensor 40. As can be seen from FIG. 3, when a source-drain voltage ($V_{DS}$) remains constant and the piezoelectric film sensor is pressed with pressure, a source-drain current ($I_{DS}$) will be gradually reduced with the increase of a gate-source voltage ($V_{GS}$).

In order to make the technical solution of the pressure disclosure better understood by a person skilled in the art, the structure of the flexible piezoelectric film sensor element and the manufacturing method thereof provided in the present disclosure are described in detail in combination with the following drawings.

Please refer to FIGS. 4A-4J. FIGS. 4A-4J are schematic diagrams of a method for manufacturing a piezoelectric film sensor circuit of one embodiment according to the present disclosure, which method may comprise steps as follows.

Figure 4A:
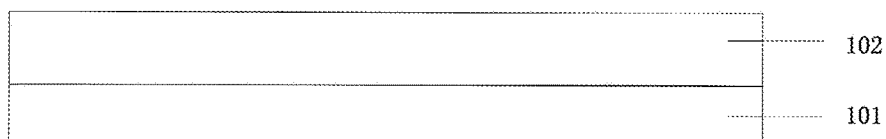
FIGS. 4A-4J are schematic diagrams of a method for manufacturing a piezoelectric film sensor circuit of one embodiment according to the present disclosure.

Step S21: please referring to FIG. 4A, a flexible base substrate 102 is formed on a rigid base substrate 101.

The rigid base substrate 101 may be a glass, ceramic, or other rigid base substrate. In this embodiment, the flexible base substrate 102 can be made of PI (polyimide), and its manufacturing method is as follows: coating a layer of PI on the rigid base substrate 101 and then baking it using a baking process so as to form the flexible base substrate 102. After the flexible base substrate 102 has been formed, it is further required to be washed.

Of course, in some other embodiments of the present disclosure, the material for manufacturing the flexible base substrate is not limited to PI, and other flexible materials can be also used.

Figure 4B:
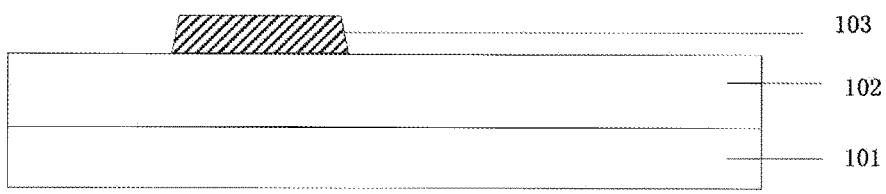

Step S22: please referring to FIG. 4B, a pattern 103 of the gate electrode of the thin film transistor is formed on the flexible base substrate 102.

In one example, a gate metal film can be formed using a magnetron sputtering process, and treated with a photoetching process (including steps of exposure, development, etching, and the like) so as to form the pattern 103 of the gate electrode. The gate metal may be a metallic material such as platinum (Pt).

Figure 4C:
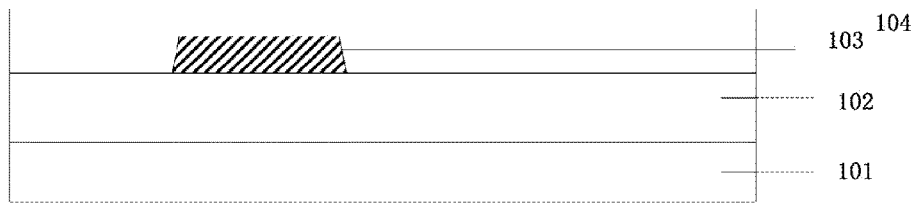

Step S23: please referring to FIG. 4C, a gate insulating layer 104 is formed.

In this embodiment, a silicon dioxide film of 30 to 40 nanometers can be deposited using a plasma enhanced chemical vapor deposition (PECVD) process, and the deposited silicon dioxide film acts as both a gate insulating layer of the thin film transistor and a buffer layer of the piezoelectric film sensor.

Figure 4D:
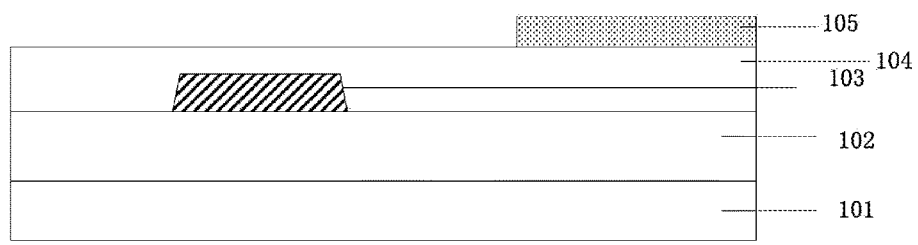

Step S24: please referring to FIG. 4D, a pattern 105 of a lower electrode of the piezoelectric film sensor is formed.

In one example, a metal film can be formed using a magnetron sputtering process, and treated with a photoetching process (including steps of exposure, development, etching, and the like) so as to form the pattern 105 of the lower electrode. The metal may be a metallic material such as platinum (Pt).

Figure 4E:
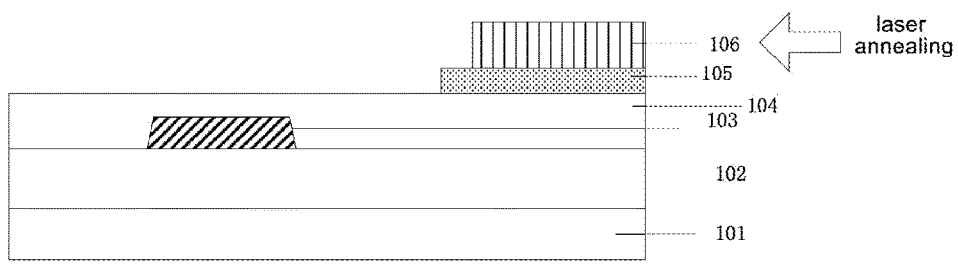
Figure 4F:
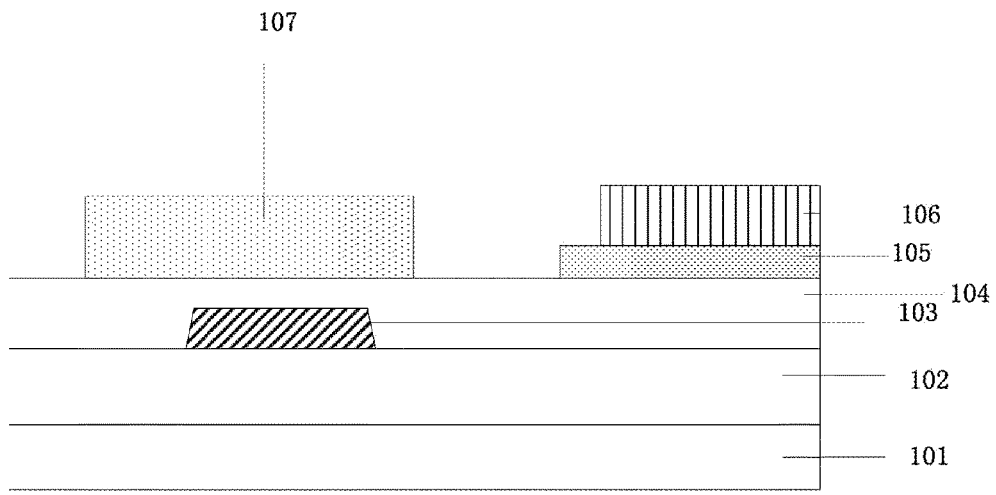
Figure 4G:
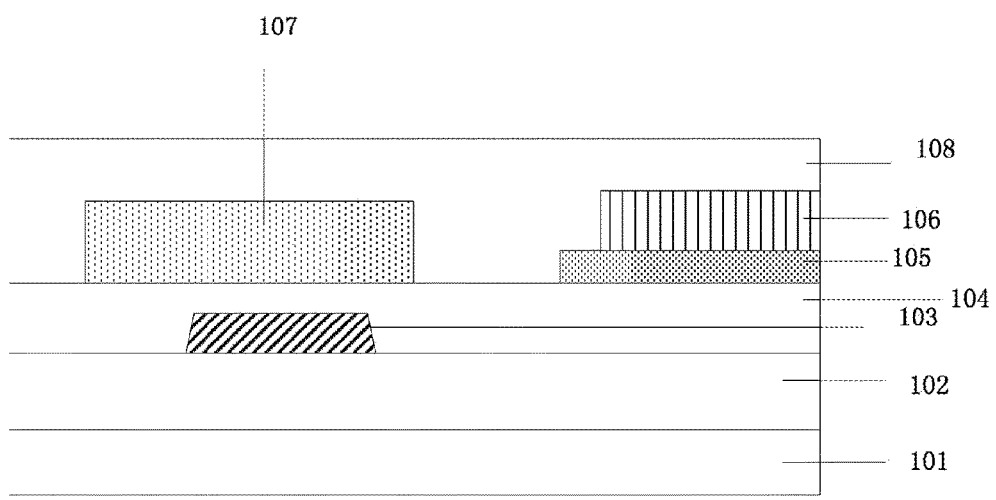

Step S25: please referring to FIG. 4E, a piezoelectric film is formed and subjected to laser annealing using a laser annealing process so as to complete the phase-forming transition of the piezoelectric film, and the annealed piezo- electric film is patterned using a photoetching process to form a pattern 106 of the piezoelectric film.

In one example, when the piezoelectric film is made of PZT, the PZT film can be formed using a coating process. In addition, the PZT material can be prepared using a sol-gel process, and the formed PZT film may have a thickness of 0.5 to 1.5 and in one example, has a thickness of 1 When the piezoelectric film is made of BZT, the BZT film can be prepared using the magnetron sputtering process.

Then, the piezoelectric film is subjected to laser annealing in a temperature range of 300 to 400° C. which can be withstood by the flexible base substrate, using a high-power carbon dioxide laser, so as to complete the phase-forming transition of the PZT film. During the laser annealing, a wavelength of a laser beam used is 10.6 μm, a power density of the laser beam is 490 W/cm$^2$, and the duration of annealing is 25 seconds.

Figure 5:
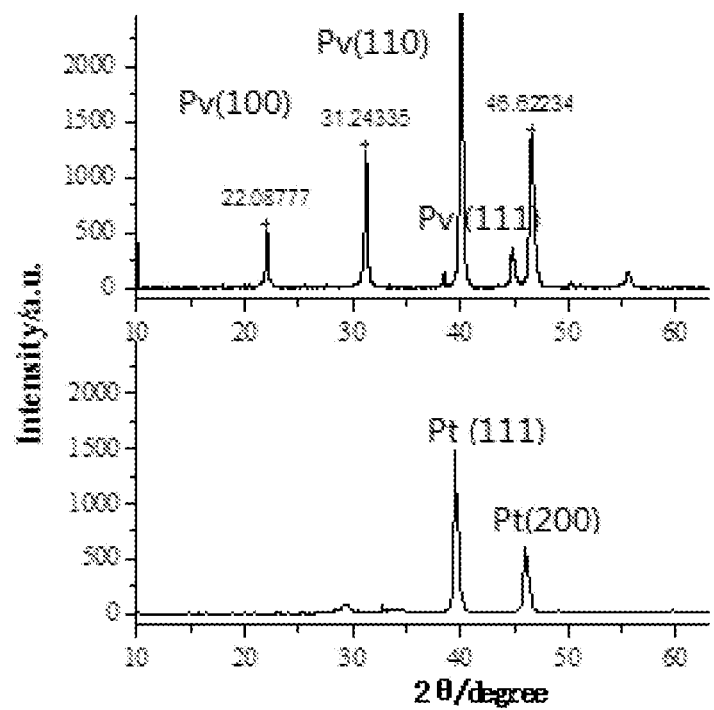
FIG. 5 shows x-ray diffraction spectra of a lead zirconate titanate ($Pb(Zr_{0.52}Ti_{0.48})O_3$, PZT) film before and after laser annealing treatment.

Please referring to FIG. 5, which shows x-ray diffraction spectra of a lead zirconate titanate ($Pb(Zr_{0.52}Ti_{0.48})O_3$, PZT) film before and after laser annealing treatment. In FIG. 5, the top spectrum is an X-ray diffraction spectrum of the PZT film which has been subjected to laser annealing, and the bottom spectrum is an X-ray diffraction spectrum of the PZT film before the laser annealing treatment. As can be seen from FIG. 5, in the X-ray diffraction spectrum of the PZT film before the annealing treatment, there is no diffraction peak for the structural phase of perovskite besides a peak for the lower electrode (Pt (111) in the spectrum). However, after the laser annealing treatment, a perfect single structural phase of perovskite $Pb(Zr_{0.52}Ti_{0.48})O_3$ (compared to the standard powder diffraction file 500346 from the International Center for Diffraction Data (ICCD)) is obtained. 2θs corresponding to three characteristic diffraction peaks of $Pb(Zr_{0.52}Ti_{0.48})O_3$, including Pv(100), Pv(110) and Pv (111), are 22.08777°, 31.24335° and 48.62234°, respectively. The degree a of orientation in the PZT film is 0.647. Moreover, no pyrochlore phase appears under the conditions of the annealing time and the laser power in the embodiments of the present disclosure, indicating that after the laser annealing treatment, the PZT film has been successfully transformed from an amorphous film structure to the required perovskite structure at a temperature lower than that of the vacuum oven annealing in the related art. This process provides a special guarantee for the piezoelectric coefficient of the piezoelectric film.

After the completion of the manufacturing of the PZT film, the PZT film is treated with a photoetching process (including steps of exposure, development, etching, and the like) to form the pattern 106 of the piezoelectric film.

Step S26: Please referring to FIG. 4F, a pattern 107 of an active layer of the thin film transistor is formed.

In one example, the preparation of the active layer can be completed using an inkjet printing method, wherein the active layer can be made of polymer, such as poly(3-hexylthiophene) or single-walled carbon nanotubes (SW-CNTs).

Step S27: Please referring to FIG. 4G, a pattern 108 of an insulating layer is formed.

In one example, an insulating film of about 2 μm can be deposited using a chemical vapor deposition (CVD) process, wherein the insulating film can be made of poly-p-xylene (i.e., Parylene). Poly-p-xylene, which has not only good electrical performance and protection performance but also good biocompatibility, has been authenticated by the U.S. Food and Drug Administration (FDA), and it satisfies the Class VI standards for biomedical materials as stipulated by the United States Pharmacopeia, and is listed as a biomedical material that can be implanted in a body for use in a long period of time.

Then, via holes for connecting the active layer with the source electrode and the drain electrode of the thin film transistor are formed in the insulating film, and via holes for connecting the lower electrode of the piezoelectric film with the source electrode or the drain electrode of the thin film transistor are formed in the insulating film, so as to form the pattern 108 of the insulating layer.

Figure 4H:
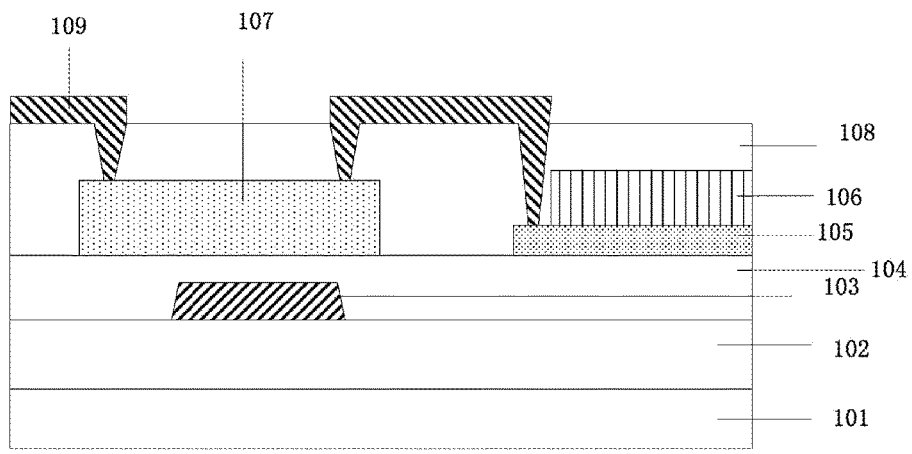

Step S28: please referring to FIG. 4H, a pattern 109 of the source electrode and the drain electrode of the thin film transistor is formed, wherein the source electrode and the drain electrode are connected with the active layer, and the source electrode or the drain electrode is connected with the lower electrode of the piezoelectric film sensor.

In one example, source and drain metal films can be deposited using a physical vapor deposition (PVD) process, and then treated using a photoetching process (including steps of exposure, development, etching and the like) to form the pattern 109 of the source electrode and the drain electrode. The source and drain metal may be copper or other metal.

Figure 4I:
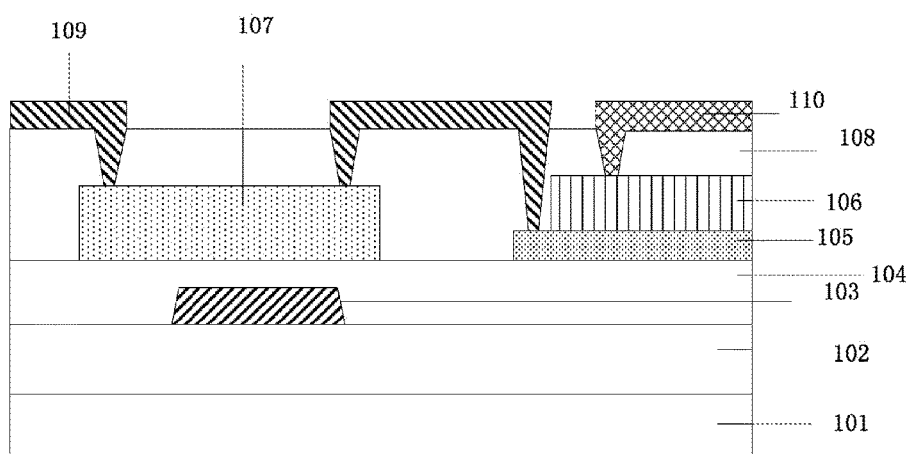

Step S29: please referring to FIG. 4I, a pattern 110 of an upper electrode of the piezoelectric film sensor is formed.

In one example, a metal film can be formed using a magnetron sputtering process, and then treated with a photoetching process (including steps of exposure, development, photoetching and the like) so as to form the pattern 110 of the upper electrode. The metal may be a metallic material such as platinum (Pt).

Figure 4J:
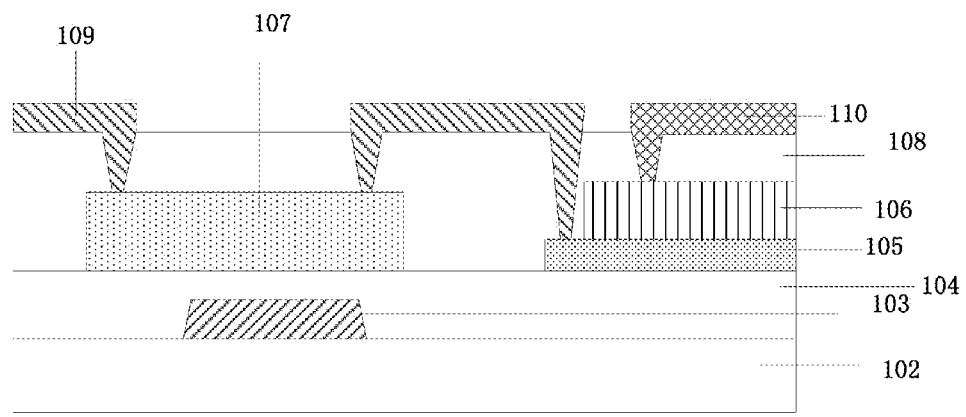

Step S210: please referring to FIG. 4J, the flexible base substrate 102 provided with the thin film transistor and the piezoelectric film sensor is peeled off from the rigid base substrate 101, so as to form the flexible piezoelectric film sensor circuit of the embodiment according to the present disclosure.

In one example, the flexible piezoelectric film sensor circuit can be peeled off from the rigid base substrate 101 by using Laser Lift Off (LLO, XeCl excimer laser of 308 nm) technology, so that the flexible plastic film piezoelectric sensor circuit prepared in the embodiment of the present disclosure is finally obtained.

Since suitable polymer material, piezoelectric film and electrode material having biocompatibility are adopted, the piezoelectric film sensor circuit manufactured using the method described above can be applied to the field of biomedical materials, such as the fields of medical monitoring and therapeutic use in vitro (choosing PZT or BZT for the manufacturing the piezoelectric film) or after being implanted in a human body (choosing BZT for manufacturing the piezoelectric film).

The present disclosure further provides a piezoelectric film sensor manufactured using the method for manufacturing a piezoelectric film sensor of any of the embodiments described above.

The present disclosure further provides a piezoelectric film sensor circuit manufactured using the method for manufacturing a piezoelectric film sensor circuit of any of the embodiments described above.

In one embodiment according to the present disclosure, the piezoelectric film sensor circuit comprises:
a flexible base substrate;
a gate electrode of a thin film transistor;
a gate insulating layer;
a lower electrode of a piezoelectric film sensor;
a piezoelectric film of the piezoelectric film sensor;
an active layer of the thin film transistor;
an insulating layer;
a source electrode and a drain electrode of the thin film transistor, wherein the source electrode and the drain electrode are connected with the active layer, and the source electrode or the drain electrode is connected with the lower electrode; and
an upper electrode of the piezoelectric film sensor.

In one example, the active layer is made of poly(3-hexylthiophene) or single-walled carbon nanotubes.

In one example, the insulating layer is made of poly-p-xylene.

The piezoelectric film sensors and piezoelectric film sensor circuits provided in the embodiments described above can be applied to the fields of medical treatment, automotive electronics, motion tracking systems, etc., especially the fields of medical and wearable devices.

The aforementioned embodiments are merely preferred embodiments of the present disclosure. It shall be indicated that, a person skilled in the art may make further modifications and improvements without departing from the principle of the present disclosure, and these modifications and improvements shall also fall within the scope of the present disclosure.

What is claimed is:

1. A method for manufacturing a piezoelectric film sensor, comprising:
a step of forming a piezoelectric film on a substrate; and
a step of subjecting the piezoelectric film to laser annealing using a laser annealing process so as to complete phase-forming transition of the piezoelectric film,
wherein an annealing temperature in the step of subjecting the piezoelectric film to laser annealing using the laser annealing process is in a range of 300° C. to 400° C.

2. The method according to claim 1, wherein the piezoelectric film is subjected to the laser annealing using a laser beam at a wavelength of 10.6 µm and a power density of 490 W/cm² for 25 seconds.

3. The method according to claim 1, wherein a laser beam for the laser annealing process is generated by a $CO_2$ laser or a $Y_3Al_{15}O_{15}$ (YAG) laser.

4. The method according to claim 1, wherein the piezoelectric film is made of lead zirconate titanate or barium zirconate titanate.

5. The method according to claim 1, wherein the piezoelectric film has a thickness in a range of 0.5 to 1.5 µm.

6. The method according to claim 1, further comprising:
a step of forming an upper electrode and a lower electrode of the piezoelectric film sensor.

7. The method according to claim 1, wherein the substrate is a flexible base substrate.

8. A method for manufacturing a piezoelectric film sensor circuit, comprising:
a step of forming a piezoelectric film sensor using the method according to claim 1; and
a step of forming a thin film transistor connected with the piezoelectric film sensor.

9. The method according to claim 8, wherein the piezoelectric film is subjected to the laser annealing using a laser beam at a wavelength of 10.6 µm and a power density of 490 W/cm² for 25 seconds.

10. The method according to claim 8, wherein a laser beam for the laser annealing process is generated by a $CO_2$ laser or a $Y_3Al_{15}O_{15}$ (YAG) laser.

11. A method for manufacturing a piezoelectric film sensor circuit, comprising:
forming a flexible base substrate on a rigid base substrate;

forming a pattern of a gate electrode of a thin film transistor on the flexible base substrate;

forming a gate insulating layer;

forming a pattern of a lower electrode of a piezoelectric film sensor;

forming a piezoelectric film, subjecting the piezoelectric film to laser annealing using a laser annealing process so as to complete phase-forming transition of the piezoelectric film, and patterning the piezoelectric film which has been subjected to laser annealing by using a photoetching process so as to form a pattern of the piezoelectric film, wherein an annealing temperature in the step of subjecting the piezoelectric film to laser annealing using the laser annealing process is in a range of 300° C. to 400° C.;

forming a pattern of an active layer of the thin film transistor;

forming a pattern of an insulating layer;

forming a pattern of a source electrode and a gate electrode of the thin film transistor, wherein the source electrode and the drain electrode are connected with the active layer, and the source electrode or the drain electrode is connected with the lower electrode of the piezoelectric film sensor;

forming a pattern of an upper electrode of the piezoelectric film sensor; and peeling off the flexible base substrate which is provided with the thin film transistor and the piezoelectric film sensor from the rigid base substrate.

12. The method according to claim 11, wherein the piezoelectric film is subjected to the laser annealing using a laser beam at a wavelength of 10.6 μm and a power density of 490 W/cm$^2$ for 25 seconds.

13. The method according to claim 11, wherein a laser beam for the laser annealing process is generated by a $CO_2$ laser or a $Y_3A_{15}O_{15}$ (YAG) laser.

14. A piezoelectric film sensor manufactured by the method according to claim 1.

15. A piezoelectric film sensor circuit comprising:

a flexible base substrate;

a gate electrode of a thin film transistor;

a gate insulating layer;

a lower electrode of a piezoelectric film sensor;

a piezoelectric film of the piezoelectric film sensor, wherein the piezoelectric film is subjected to laser annealing using a laser annealing process so as to complete phase-forming transition of the piezoelectric film, and wherein an annealing temperature in the step of subjecting the piezoelectric film to laser annealing using the laser annealing process is in a range of 300° C. to 400° C.;

an active layer of the thin film transistor;

an insulating layer;

a source electrode and a drain electrode of the thin film transistor, wherein the source electrode and the drain electrode are connected with the active layer, and the source electrode or the drain electrode is connected with the lower electrode; and an upper electrode of the piezoelectric film sensor.

16. The piezoelectric film sensor circuit according to claim 15, wherein the active layer is made of poly(3-hexylthiophene) or single-walled carbon nanotubes.

17. The piezoelectric film sensor circuit according to claim 15, wherein the insulating layer is made of poly-p-xylene.

18. The method according to claim 1, wherein the piezoelectric film forms a single structural phase of perovskite after the laser annealing.

* * * * *